US012660664B2

(12) United States Patent     (10) Patent No.:   US 12,660,664 B2

Kim et al.     (45) Date of Patent:     Jun. 16, 2026

(54) SEMICONDUCTOR PACKAGE

(71) Applicant: Samsung Electronics Co., Ltd., Suwon-si (KR)

(72) Inventors: Byungho Kim, Suwon-si (KR); Youngchan Ko, Suwon-si (KR); Gyeongho Kim, Suwon-si (KR); Yongkoon Lee, Suwon-si (KR); Myungdo Cho, Suwon-si (KR); Sangseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 18/218,885

(22) Filed: Jul. 6, 2023

(65) Prior Publication Data

US 2024/0055338 A1     Feb. 15, 2024

(30) Foreign Application Priority Data

Aug. 12, 2022    (KR) ........................ 10-2022-0101586

(51) Int. Cl.
    *H01L 23/498*     (2006.01)
    *H01L 23/00*     (2006.01)
    *H01L 23/31*     (2006.01)

(52) U.S. Cl.
    CPC .... *H01L 23/49822* (2013.01); *H01L 23/3128* (2013.01); *H01L 23/49827* (2013.01); (Continued)

(58) Field of Classification Search
    None
    See application file for complete search history.

(56) References Cited

U.S. PATENT DOCUMENTS 8,890,294 B2    11/2014   Cho et al.
9,881,908 B2    1/2018   Lin et al.
(Continued)

FOREIGN PATENT DOCUMENTS

JP     2018-93162 A    6/2018
KR     10-1947722 B1    4/2019
(Continued)

OTHER PUBLICATIONS

Communication dated Jan. 29, 2026 issued by the Korean Ministry of Intellectual Property in counterpart Korean Patent Application No. 10-2022-0101586.

*Primary Examiner* — Cory W Eskridge

(74) *Attorney, Agent, or Firm* — Sughrue Mion, PLLC

(57) ABSTRACT

A fan-out semiconductor package includes a wiring substrate including a first fan-in region, a fan-out region surrounding the first fan-in region, and a second fan-in region, a first fan-in chip structure, a second fan-in chip structure, a first redistribution structure including first redistribution elements disposed on a bottom surface of the wiring substrate, and a second redistribution structure disposed on a top surface of the wiring substrate, and a chip wiring structure formed on a top surface of the second chip, and the second redistribution structure includes a second redistribution layer extending to the first fan-in region and the fan-out region, a plurality of second redistribution vias integrally formed with the second redistribution layer and extending downward, and a seed layer surrounding the second redistribution layer and bottom surfaces of the plurality of second redistribution vias.

20 Claims, 17 Drawing Sheets

(52) U.S. Cl.
CPC .............. *H01L 24/08* (2013.01); *H01L 24/16* (2013.01); *H01L 24/32* (2013.01); *H01L 24/48* (2013.01); *H01L 2224/08135* (2013.01); *H01L 2224/16055* (2013.01); *H01L 2224/16165* (2013.01); *H01L 2224/32054* (2013.01); *H01L 2224/32146* (2013.01); *H01L 2224/32235* (2013.01); *H01L 2224/48108* (2013.01); *H01L 2224/48145* (2013.01); *H01L 2924/01022* (2013.01); *H01L 2924/01029* (2013.01); *H01L 2924/13091* (2013.01); *H01L 2924/15174* (2013.01)

(56) References Cited

U.S. PATENT DOCUMENTS

| | | | |
|---|---|---|---|
| 10,050,016 B2 | 8/2018 | Lee et al. | |
| 10,056,351 B2 | 8/2018 | Yu et al. | |
| 10,861,823 B2 | 12/2020 | Pan et al. | |
| 11,171,016 B2 | 11/2021 | Chen et al. | |
| 11,264,330 B2 | 3/2022 | Kwon et al. | |
| 2016/0020172 A1* | 1/2016 | Su | H01L 23/5382 |
| | | | 257/530 |
| 2017/0092581 A1* | 3/2017 | Chiu | H01L 23/49822 |
| 2019/0181096 A1* | 6/2019 | Wu | H01L 23/552 |
| 2021/0118765 A1* | 4/2021 | Kang | H01L 23/5389 |
| 2021/0280523 A1 | 9/2021 | We et al. | |
| 2023/0052194 A1* | 2/2023 | Kim | H01L 23/3128 |

FOREIGN PATENT DOCUMENTS

| | | |
|---|---|---|
| KR | 10-2020-0134035 A | 12/2020 |
| KR | 10-2020-0137220 A | 12/2020 |
| KR | 10-2022-0042705 A | 4/2022 |

\* cited by examiner

FIG. 2

SEMICONDUCTOR PACKAGE

CROSS-REFERENCE TO RELATED APPLICATION

This application claims priority to Korean Patent Application No. 10-2022-0101586, filed on Aug. 12, 2022, in the Korean Intellectual Property Office, the disclosure of which is incorporated by reference herein in its entirety.

BACKGROUND

The present disclosure relates to a semiconductor package, and more particularly, a fan-out semiconductor package.

To improve the performance of a semiconductor package, it is necessary to increase the number of external connection terminals of the semiconductor package. To increase the number of the external connection terminals, it is necessary to secure a sufficient planar area of the semiconductor package. Meanwhile, to reduce manufacturing cost, it is necessary to reduce the planar area of the semiconductor chip. To package a semiconductor chip having a reduced size while securing a sufficient planar area of a semiconductor package for an increases number of external connection terminals, a fan-out package in which a semiconductor chip is connected to external connection terminals by using a connection structure having a greater planar area than that of the semiconductor chip has been developed.

SUMMARY

The present disclosure provides a high-performance semiconductor package having a small planar area.

According to an aspect of an example embodiment, a fan-out semiconductor package includes: a wiring substrate comprising a first fan-in region corresponding to a first through hole disposed in the wiring substrate, a fan-out region surrounding the first fan-in region, and a second fan-in region corresponding to a second through hole disposed apart from the first through hole with the fan-out region therebetween; a first fan-in chip structure disposed in the first through hole; a second fan-in chip structure disposed in the second through hole; a first redistribution structure comprising first redistribution elements disposed on a bottom surface of the wiring substrate; and a second redistribution structure disposed on a top surface of the wiring substrate, wherein the first fan-in chip structure comprises a first chip, a second chip bonded to a surface of the first chip, and a chip wiring structure disposed on a top surface of the second chip, and wherein the second redistribution structure comprises a second redistribution layer extending to the first fan-in region and the fan-out region, a plurality of second redistribution vias integrally formed with the second redistribution layer and extending downward, and a seed layer surrounding bottom surfaces of the second redistribution layer and the plurality of second redistribution vias.

According to an aspect of an example embodiment, a fan-out semiconductor package includes: a wiring substrate comprising a first fan-in region corresponding to a first through hole formed in the wiring substrate, a fan-out region surrounding the first fan-in region, and a second fan-in region corresponding to a second through hole disposed apart from the first through hole with the fan-out region therebetween; a first fan-in chip structure disposed in the first through hole; a second fan-in chip structure disposed in the second through hole; a first redistribution structure comprising first redistribution elements disposed on a bottom surface of the wiring substrate; and a second redistribution structure disposed on a top surface of the wiring substrate, wherein the first fan-in chip structure comprises a first chip, a second chip having a bottom surface bonded to a bottom surface of the first chip, and a first chip wiring structure formed on a top surface of the second chip, wherein the second fan-in chip structure comprises a third chip, a fourth chip having a bottom surface bonded to a bottom surface of the third chip, and a second chip wiring structure formed on a top surface of the fourth chip, and wherein the second redistribution structure comprises a second redistribution layer extending to the first fan-in region and the fan-out region, a plurality of second redistribution vias integrally formed with the second redistribution layer and extending downward, and a seed layer surrounding bottom surfaces of the second redistribution layer and the plurality of second redistribution vias.

According to an aspect of an example embodiment, a fan-out semiconductor package includes: a wiring substrate comprising a first fan-in region corresponding to a first through hole disposed in the wiring substrate, a fan-out region surrounding the first fan-in region, and a second fan-in region corresponding to a second through hole disposed apart from the first through hole with the fan-out region therebetween; a first fan-in chip structure disposed in the first through hole; a second fan-in chip structure disposed in the second through hole; a first redistribution structure comprising first redistribution elements disposed on a bottom surface of the wiring substrate; and a second redistribution structure disposed on a top surface of the wiring substrate, wherein the first fan-in chip structure comprises a first chip, a second chip having a bottom surface bonded to a bottom surface of the first chip, and a chip wiring structure disposed on a top surface of the second chip, wherein the second fan-in chip structure comprises a third chip and third chip wiring pads, wherein the first redistribution elements are electrically connected to the third chip wiring pads, wherein the second redistribution structure comprises a second redistribution layer extending to the first fan-in region and the fan-out region, a plurality of second redistribution vias integrally formed with the second redistribution layer and extending downward, and a seed layer surrounding bottom surfaces of the second redistribution layer and the plurality of second redistribution vias and comprising a Ti—Cu alloy, wherein the chip wiring structure further comprises chip wiring pads, wherein the seed layer is electrically connected to the chip wiring pads, wherein bottom surfaces of the first chip and the second chip are inactive surfaces, wherein top surfaces of the first chip and the second chip are active surfaces, wherein the first fan-in chip structure further comprises a bonding layer disposed between the first chip and the second chip and wherein the bonding layer is configured to bond the bottom surface of the first chip to the bottom surface of the second chip, wherein the wiring substrate comprises at least one of an insulating substrate or a semiconductor substrate, wherein the first fan-in chip structure is embedded in the first through hole and sealed by an encapsulation layer, and wherein the second fan-in chip structure is embedded in the second through hole and sealed by the encapsulation layer.

BRIEF DESCRIPTION OF DRAWINGS

The above and other aspects and features will be more apparent from the following description of example embodiments, taken in conjunction with the accompanying drawings, in which:

FIG. 2 is a cross-sectional view of a fan-out semiconductor package according to an example embodiment;

DETAILED DESCRIPTION

Figure 1:
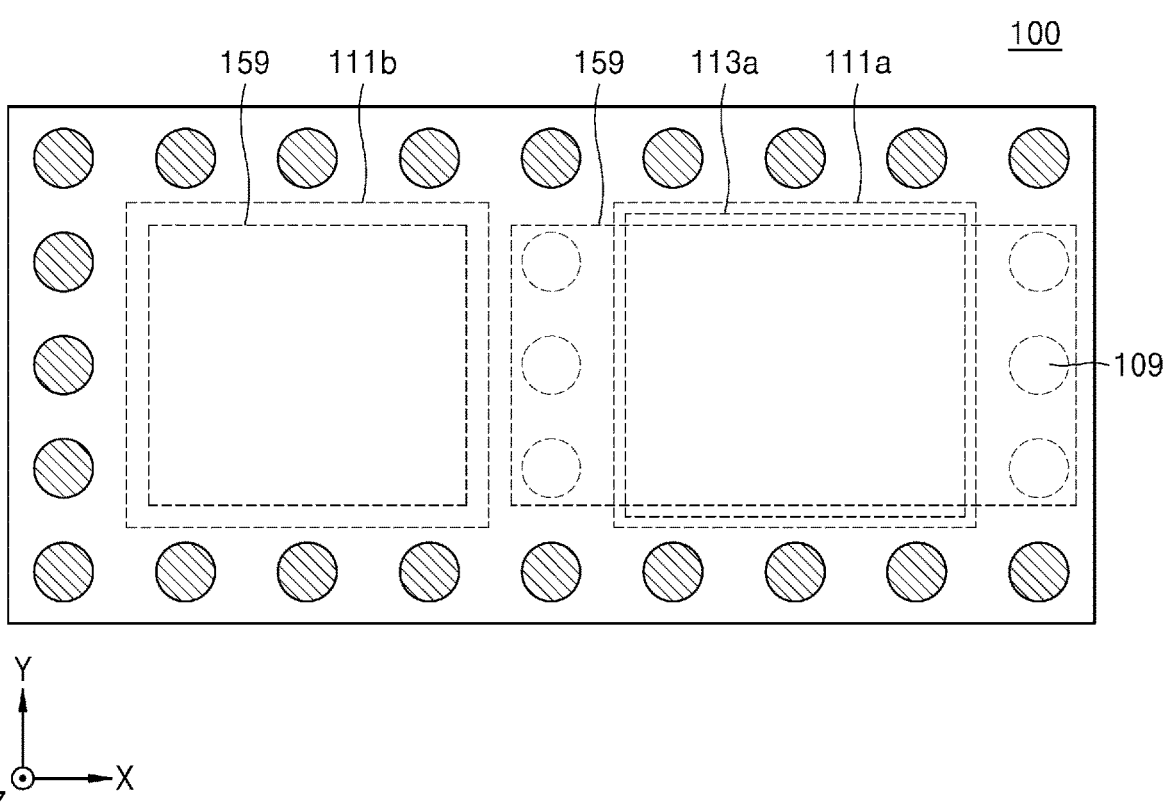
FIG. 1 is a plan view of a fan-out semiconductor package according to an example embodiment.

FIG. 1 is a plan view of a fan-out semiconductor package 100 according to an embodiment.

Referring to FIG. 1, the fan-out semiconductor package 100 according to the present example embodiment may include a plurality of substrate wiring pads 109, a first chip 111a, a second chip 113a, a third chip 111b, and second redistribution layers 159. The second redistribution layers 159 may be arranged to vertically overlap portions of the second chip 113a and the third chip 111b. A second redistribution layer 159 disposed to overlap a portion of the second chip 113a may be disposed to vertically overlap with the plurality of substrate wiring pads 109. The plurality of substrate wiring pads 109 may surround the first chip 111a, the second chip 113a, and the third chip 111b.

The fan-out semiconductor package 100 may be a lower fan-out semiconductor package 100 or an upper fan-out semiconductor package 100 constituting a package on package (PoP) type semiconductor package.

Figure 2:
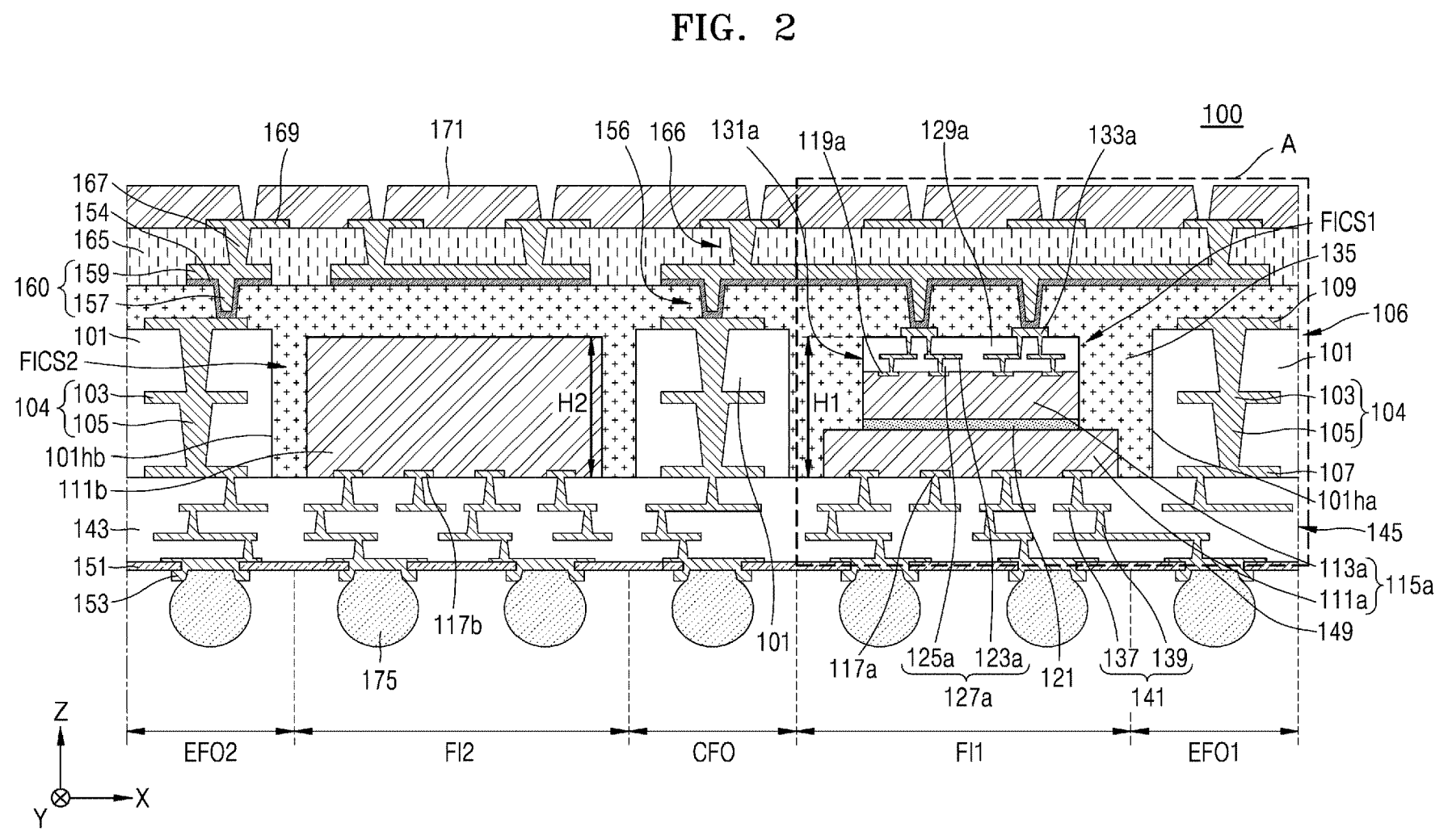
Figure 3:
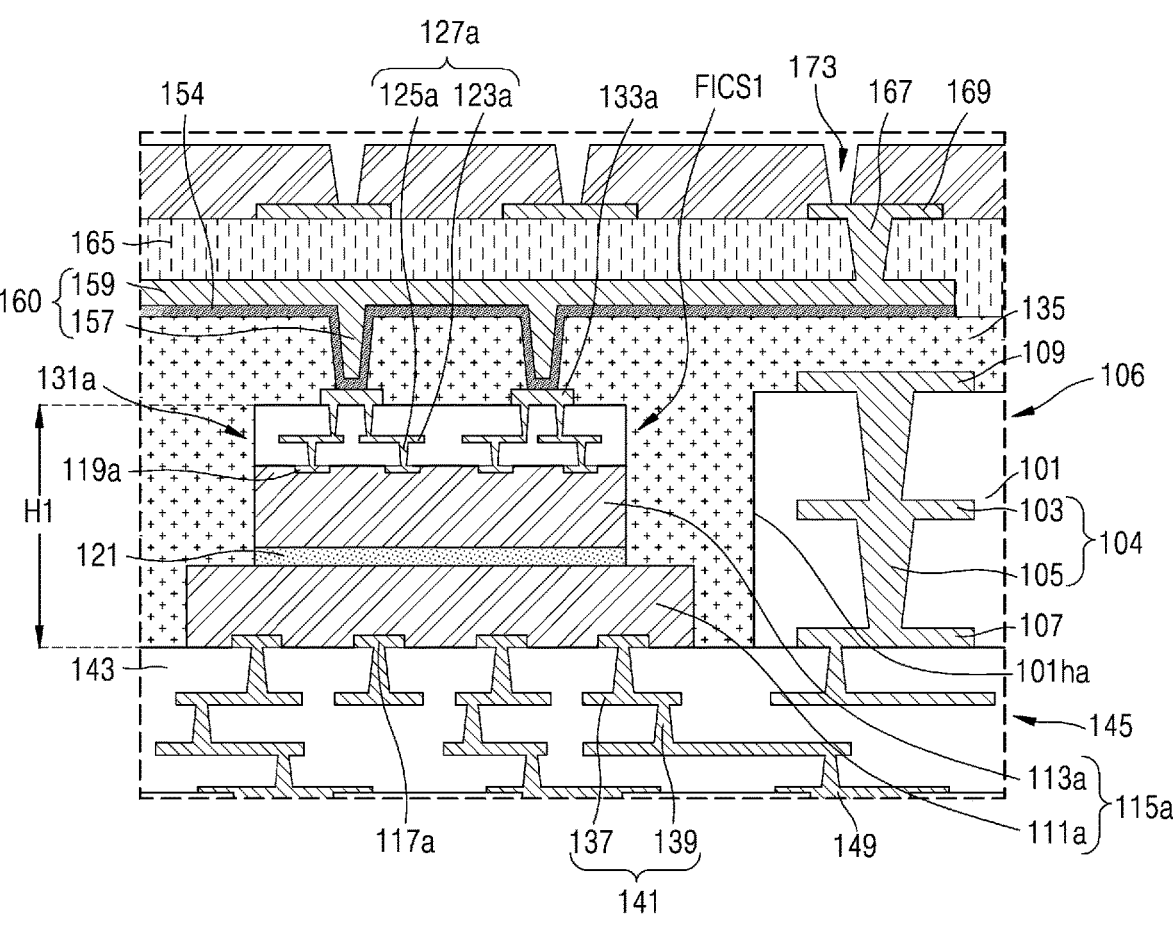
FIG. 3 is an enlarged view of a portion "A" shown in FIG. 2.
Figure 3:
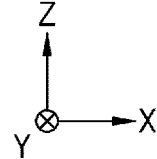

FIG. 2 is a cross-sectional view of a fan-out semiconductor package 100 according to an example embodiment, and FIG. 3 is an enlarged view of a portion "A" shown in FIG. 2.

Referring to FIG. 2, the fan-out semiconductor package 100 may include a wiring substrate 106 including a first fan-in region FI1 corresponding to a first through hole 101ha formed in the fan-out semiconductor package 100 and a center fan-out region CFO and a first edge fan-out region EFO1 that are respectively located at two opposite sides of the first fan-in region FI1. The wiring substrate 106 may also include a second fan-in region FI2 corresponding to a second through hole 101hb formed in the fan-out semiconductor package 100 and the center fan-out region CFO and a second edge fan-out region EFO2 that are respectively located at two opposite sides of the second fan-in region FI2. The first fan-in region FI1 and the second fan-in region FI2 may be collectively referred to as a fan-in region FI. The center fan-out region CFO, the first edge fan-out region EFO1, and the second edge fan-out region EFO2 may be collectively referred to as a fan-out region FO.

According to an example embodiment, the wiring substrate 106 may be an insulating substrate. The wiring substrate 106 may be a printed circuit board (PCB). Alternatively, the wiring substrate 106 may be referred to as a frame substrate. The fan-out semiconductor package 100 may be a package in the form of a fan-out panel level package (FOPLP). The wiring substrate 106 may include a body 101 positioned on both sides of the first through hole 101ha and the second through hole 101hb, a substrate wiring structure 104 formed in the body 101, and substrate wiring pads 107 and 109.

The first through hole 101ha and the second through hole 101hb may penetrate through the top surface and the bottom surface of the body 101. The body 101 may include at least one material selected from among phenol resin, epoxy resin, and polyimide. For example, the body 101 may include at least one material selected from among Frame Retardant 4 (FR4), tetrafunctional epoxy, polyphenylene ether, epoxy/polyphenylene oxide, bismaleimide triazine (BT), Thermount, cyanate ester, polyimide, and liquid crystal polymer.

The substrate wiring structure 104 may include substrate wiring layers 103 formed in the body 101 and substrate vias 105 connecting the substrate wiring layers 103 to one another. The substrate wiring pads 107 and 109 may include a first substrate wiring pad 107 located on the bottom surface of the body 101 and electrically connected to the substrate wiring structure 104 and a second substrate wiring pad 109 located on the top surface of the body 101 and electrically connected to the substrate wiring structure 104.

The first substrate wiring pad 107 may be a part of a substrate wiring layer 103 located on the bottom surface of the body 101. The second substrate wiring pad 109 may be a part of the substrate wiring layer 103 located on the top surface of the body 101.

One or more of substrate wiring layer 103, a substrate via 105, and the substrate wiring pads 107 and 109 may include a metal layer. For example, the substrate wiring layer 103 and the substrate wiring pads 107 and 109 may each include an electrolytically deposited (ED) copper foil, a rolled-annealed (RA) copper foil, a stainless steel foil, an aluminum foil, a ultra-thin copper foil, sputtered copper, a copper alloy, etc. The substrate via 105 may include, for example, copper, nickel, stainless steel, or beryllium copper.

The fan-out semiconductor package 100 may include a first fan-in chip structure FICS1 disposed in the first through hole 101ha. The first fan-in chip structure FICS1 may be referred to as a fan-in chip package structure. According to some example embodiments, a portion of the wiring substrate 106 corresponding to the first fan-in chip structure FICS1 may correspond to the first fan-in region FI1. The fan-out semiconductor package 100 may include the center fan-out region CFO and the first edge fan-out region EFO1 surrounding the first through hole 101ha. Also, the fan-out semiconductor package 100 may include a second fan-in chip structure FICS2 disposed in the second through hole 101hb. According to some example embodiments, a portion of the wiring substrate 106 corresponding to the second fan-in chip structure FICS2 may correspond to the second fan-in region FI2. The fan-out semiconductor package 100 may include the center fan-out region CFO and the second edge fan-out region EFO2 surrounding the second through hole 101hb. The center fan-out region CFO, the first edge fan-out region EFO1, and the second edge fan-out region EFO2 may be collectively referred to as a fan-out region FO.

According to an example embodiment, top surfaces of the first fan-in chip structure FICS1 and the second fan-in chip structure FICS2 may be located at a level lower than or at the same level as the top surface of the wiring substrate 106. According to some example embodiments, the first fan-in chip structure FICS1 and the second fan-in chip structure FICS2 may be embedded in the first through hole 101ha and the second through hole 101hb, respectively. Also, a height H1 of the first fan-in chip structure FICS1 may be smaller than or equal to a height H2 of the second fan-in chip structure FICS2.

The first fan-in chip structure FICS1 may include first stacked chips 115a and a first chip wiring structure 131a. The first chip wiring structure 131a may be referred to as a chip redistribution structure. The first stacked chips 115a may include the first chip 111a and the second chip 113a. The fan-out semiconductor package 100 may include the first stacked chips 115a to improve an integration capacity. The second fan-in chip structure FICS2 may include the third chip 111b.

According to an example embodiment, one or both of the first stacked chips 115a and the third chip 111b may include individual devices. The individual devices may include various microelectronic devices, e.g., a metal-oxide-semiconductor field effect transistor (MOSFET) like a complementary metal-insulator-semiconductor transistor (CMOS transistor), a system large scale integration (LSI), an image sensor like a CMOS image sensor (CIS), a micro-electromechanical system (MEMS), an active device, a passive device, etc.

In the first stacked chips 115a, the second chip 113a may be stacked on the first chip 111a. In the first stacked chips 115a, the first chip 111a and the second chip 113a may be bonded to each other through an adhesive layer 121. According to an example embodiment, the first chip 111a, the second chip 113a, and the third chip 111b may be chips of the same type. The first chip 111a, the second chip 113a, or the third chip 111b may be, for example, a logic chip, a power management integrated circuit (PMIC) chip, or a memory chip. According to some example embodiments, the logic chip may each be, for example, a central processing unit (CPU) chip, a graphics processing unit (GPU) chip, or an application processor (AP) chip.

According to an example embodiment, the memory chip may be a dynamic random access memory (DRAM) chip, a static random access memory (SRAM) chip, a flash memory chip, an electrically erasable and programmable read-only memory, (EEPROM) chip, a phase-change random access memory (PRAM) chip, a magnetic random access memory (MRAM) chip, or a resistive random access memory (RRAM) chip.

According to an example embodiment, the first chip 111a, the second chip 113a, and the third chip 111b may be chips of different types. For example, the first chip 111a may be a logic chip as described above, the second chip 113a may be a PMIC chip, and the third chip 111b may be a memory chip.

Figure 8:
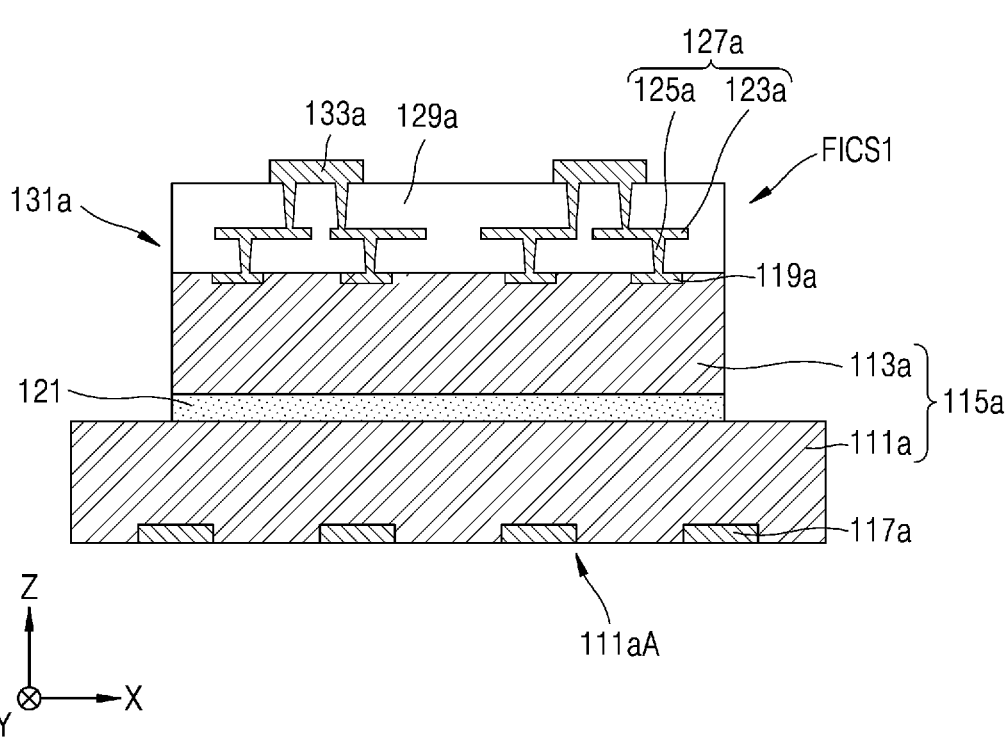

Referring to FIG. 8 together, the first chip 111a may have a top surface 111aA and a bottom surface 111aB. The top surface 111aA may be an active surface on which individual devices are formed, and the bottom surface 111aB may be an inactive surface on which individual devices are not formed. In the example embodiment, the first chip 111a may be disposed upside-down. Accordingly, in the example embodiment, the top surface 111aA, which is an active surface on which individual devices are formed, of the first chip 111a may face downward.

Figure 7:
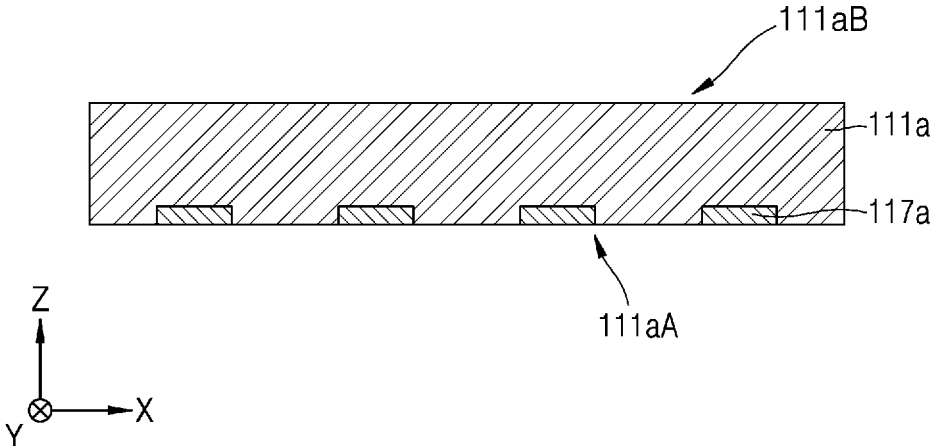

Referring to FIG. 7 together, the second chip 113a may have a top surface and a bottom surface 113aB. The top surface may be an active surface on which individual elements are formed, and the bottom surface 113aB may be an inactive surface on which individual elements are not formed. The top surface, which is an active surface on which individual devices are formed, of the second chip 113a may face upward.

The third chip 111b may have a top surface and a bottom surface. The top surface may be an active surface on which individual elements are formed, and the bottom surface may be an inactive surface on which individual elements are not formed. The top surface, which is an active surface on which individual devices are formed, of the third chip 111b may face upward.

In the first stacked chips 115a, the bottom surface 111aB of the first chip 111a and the bottom surface 113aB of the second chip 113a may be bonded to each other via the adhesive layer 121. A first chip pad 117a may be disposed on the top surface 111aA of the first chip 111a. A second chip pad 119a may be disposed on the top surface of the second chip 113a. The first chip pad 117a and the second chip pad 119a may be metal pads like aluminum pads or copper pads. The first chip pad 117a and the second chip pad 119a may be electrically conductive pads.

The first chip wiring structure 131a may be disposed on the second chip 113a. The first chip wiring structure 131a may be disposed inside the first fan-in region FI1 excluding the center fan-out region CFO and the first edge fan-out region EFO1. The first chip wiring structure 131a may be electrically connected to the second chip pad 119a in the first fan-in region FI1.

The first chip wiring structure 131a may be formed in the first fan-in region FI1 through a photolithography process. Since the fan-out semiconductor package 100 includes the first chip wiring structure 131a formed in the first fan-in region FI1 through a photolithography process, the design freedom of the second chip 113a may be increased.

The first chip wiring structure 131a may include a first chip wiring element 127a and a first chip wiring pad 133a. The first chip wiring element 127a may include first chip wiring layers 123a formed in a first chip wiring insulation layer 129a and first chip vias 125a electrically connecting the first chip wiring layers 123a to one another. The first chip wiring pad 133a may be electrically connected to the first chip wiring element 127a.

The first chip wiring pad 133a may be a part of the uppermost first chip wiring layer 123a. The first chip wiring element 127a may include the same material as the substrate wiring structure 104. The first chip wiring pad 133a may include the same material as the substrate wiring pads 107 and 109.

The fan-out semiconductor package 100 may include a first redistribution structure 145. The first redistribution structure 145 may be disposed on the bottom surface of the wiring substrate 106, the bottom surface of the first fan-in chip structure FICS1, and the bottom surface of the second fan-in chip structure FICS2. The first redistribution structure 145 may extend to the fan-in region FI and the fan-out region FO within a first redistribution insulation layer 143 and may include redistributed first redistribution elements 141. The first redistribution elements 141 may include the first redistribution layers 137 and the first redistribution vias 139 connecting the first redistribution layers 137 to one another.

The first redistribution elements 141 may be electrically connected to the first chip pad 117a in the first fan-in region FI1. The first redistribution elements 141 may include the same material as the substrate wiring structure 104.

The first redistribution structure 145 may include first redistribution pads 149 electrically connected to the first redistribution elements 141. A first redistribution pad 149 may be a part of a first redistribution layer 137 located on the top surface of the first redistribution insulation layer 143.

The first redistribution pads 149 may include the same material as the substrate wiring pads 107 and 109. A barrier metal layer 153, e.g., a nickel layer or a copper layer, may be formed on the first redistribution pads 149. The barrier metal layer 153 may be electrically separated by a first passivation layer 151.

The bottom surface of the first passivation layer 151 may have the same surface as the bottom surface of the barrier metal layer 153. The first redistribution pads 149 may be electrically separated by the first passivation layer 151. First external connection terminals 175 may be formed on the barrier metal layer 153. The first external connection terminals may be, for example, solder balls.

The fan-out semiconductor package 100 may include an encapsulation layer 135. The encapsulation layer 135 may be formed on the first fan-in chip structure FICS1 embedded in the first through hole 101ha, the second fan-in chip structure FICS2 embedded in the second through hole 101hb, and the wiring substrate 106. The encapsulation layer 135 may be formed on both side surfaces of the first fan-in chip structure FICS1 in the first through hole 101ha and the second fan-in chip structure FICS2 in the second through hole 101hb. The encapsulation layer 135 may surround the first fan-in chip structure FICS1 in the first through hole 101ha and the second fan-in chip structure FICS2 in the second through hole 101hb when viewed from above. The encapsulation layer 135 may include, for example, an epoxy molding compound (EMC).

According to an example embodiment, the fan-out semiconductor package 100 may include a second redistribution structure 156. The second redistribution structure 156 may be disposed on the top surface of the wiring substrate 106 and the top surface of the first chip wiring structure 131a. The second redistribution structure 156 may be formed in the encapsulation layer 135.

The second redistribution structure 156 may extend to the fan-out region FO and may include the redistributed second redistribution element 160 and a seed layer 154 formed on the bottom surface of the second redistribution element 160. The second redistribution elements 160 may include the second redistribution layers 159 and the second redistribution vias 157. The second redistribution elements 160 may be electrically connected to the first chip wiring pad 133a of the first fan-in chip structure FICS1.

The second redistribution layers 159 may extend, when viewed from above, from the fan-in region FI to the fan-out region FO and redistributed. The plurality of second redistribution vias 157 may be integrally formed with the second redistribution layer 159 and extend downward. The second redistribution element 160 may be electrically connected to the second chip pad 119a in the fan-in region FI. FIGS. 2 and 3 are cross-sectional views, and the second redistribution layers 159 are illustrated as being spaced apart from one another owing to the cross-sectional nature of the view. The second redistribution layers 159 may be integrally formed and continuously connected. The second redistribution elements 160 may include the same material as the substrate wiring structure 104.

The seed layer 154 may be formed to surround the bottom surface of the second redistribution layer 159 extending from the fan-in region FI to the fan-out region FO. Also, the seed layer 154 may be formed integrally with the second redistribution layer 159 to surround bottom surfaces of the plurality of second redistribution vias 157 extending downward. The seed layer 154 may include a Ti—Cu alloy. By forming the seed layer 154 before forming the second redistribution layer 159, the second redistribution layer 159 may be formed more finely than in the case of forming the second redistribution layer 159 including a metal on a third redistribution insulation layer 165 including an oxide or a nitride without the seed layer 154. The seed layer 154 may be electrically connected to the first chip wiring pad 133a included in the first chip wiring structure 131a. Also, the seed layer 154 may be electrically connected to the second substrate wiring pad 109 included in the substrate wiring structure 104.

According to an example embodiment, the fan-out semiconductor package 100 may include a third redistribution structure 166. The third redistribution structure 166 may be disposed on the second redistribution structure 156. The third redistribution structure 166 may be formed in the third redistribution insulation layer 165.

The third redistribution structure 166 may include third redistribution vias 167. The third redistribution vias 167 may be electrically connected to the second redistribution layer 159. Also, the third redistribution vias 167 may be electrically connected to third redistribution pads 169. The third redistribution pads 169 may be a part of the second redistribution layer 159.

The third redistribution pads 169 may be electrically isolated by a second passivation layer 171. The third redistribution pads 169 may include the same material as the substrate wiring pads 107 and 109. The third redistribution pads 169 may be exposed to the outside through pad exposure holes 173. Second external connection terminals (not shown), may be formed on the third redistribution pads 169 and may be, for example, solder balls.

As described above, the fan-out semiconductor package 100 of the example embodiments may have an improved integration capacity that may be aided by the inclusion of the first stacked chips 115a. Also, the fan-out semiconductor package 100 of the example embodiments may reduce a signal connection length between the first fan-in chip structure FICS1 and the second fan-in chip structure FICS2 by forming the second fan-in chip structure FICS2 electrically connected to the second redistribution layer 159 to be a certain distance spaced apart from the first fan-in chip structure FICS1 including the first stacked chips 115a.

Figure 4:
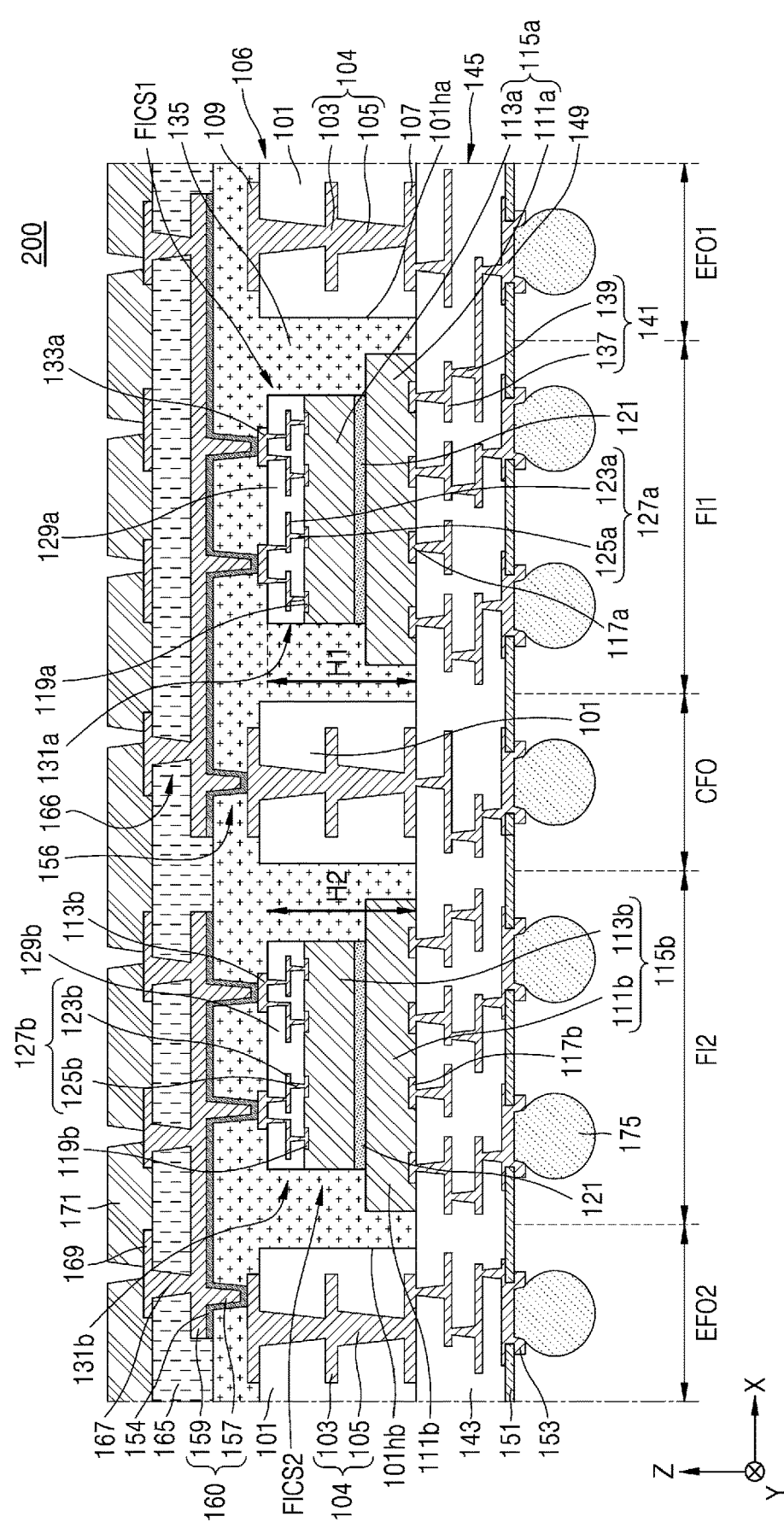
FIG. 4 is a cross-sectional view of a fan-out semiconductor package according to another example embodiment.

FIG. 4 is a cross-sectional view of a fan-out semiconductor package 200 according to another example embodiment.

In detail, the fan-out semiconductor package 200 may be substantially the same as the fan-out semiconductor package 100 of FIGS. 1 to 3, except that the second fan-in chip structure FICS2 may include second stacked chips 115b. Reference numerals identical to those as in FIGS. 1 to 3 denote the same elements. In FIG. 4, descriptions identical to those given above with reference to FIGS. 1 to 3 will be briefly given or omitted.

The fan-out semiconductor package 200 may include a second fan-in chip structure FICS2 disposed in the second through hole 101hb. According to some example embodiments, the wiring substrate 106 corresponding to the second fan-in chip structure FICS2 may correspond to the second fan-in region FI2.

The second fan-in chip structure FICS2 may include the second stacked chips 115b and a second chip wiring structure 131b. The second chip wiring structure 131b may be referred to as a chip redistribution structure. The second stacked chips 115b may include the third chip 111b and a fourth chip 113b. The fan-out semiconductor package 200 may include the second stacked chips 115b and including the second stacked chips 115 may improve an integration capacity.

According to an example embodiment, the second stacked chips 115b may include individual devices. The individual devices may include various microelectronic devices, e.g., MOSFETs like CMOS transistors, system LSIs, image sensors like CIS, MEMS, active devices, passive devices, etc.

In the second stacked chips 115b, the fourth chip 113b may be stacked on the third chip 111b. In the second stacked chips 115*b*, the third chip 111*b* and the fourth chip 113*b* may be bonded to each other through the adhesive layer 121. According to an example embodiment, the third chip 111*b* and the fourth chip 113*b* may be chips of the same type. The third chip 111*b* and the fourth chip 113*b* may each be a logic chip, a PMIC chip, or a memory chip. According to some example embodiments, the logic chip may be, for example, a CPU chip, a GPU chip, or an AP chip.

According to an example embodiment, the memory chip may be a DRAM chip, an SRAM chip, a flash memory chip, an EPROM chip, a PRAM chip, an MRAM chip, or an ARAM chip.

According to an example embodiment, the third chip 111*b* and the fourth chip 113*b* may be chips of different types. For example, the third chip 111*b* may be a logic chip as described above, and the fourth chip 113*b* may be a memory chip.

The third chip 111*b* may have a top surface and a bottom surface. The top surface may be an active surface on which individual elements are formed, and the bottom surface may be an inactive surface on which individual elements are not formed. In the example embodiment, the third chip 111*b* may be disposed upside-down. Accordingly, in the example embodiment, the top surface, which is an active surface on which individual devices are formed, of the third chip 111*b* may face downward.

Figure 6:
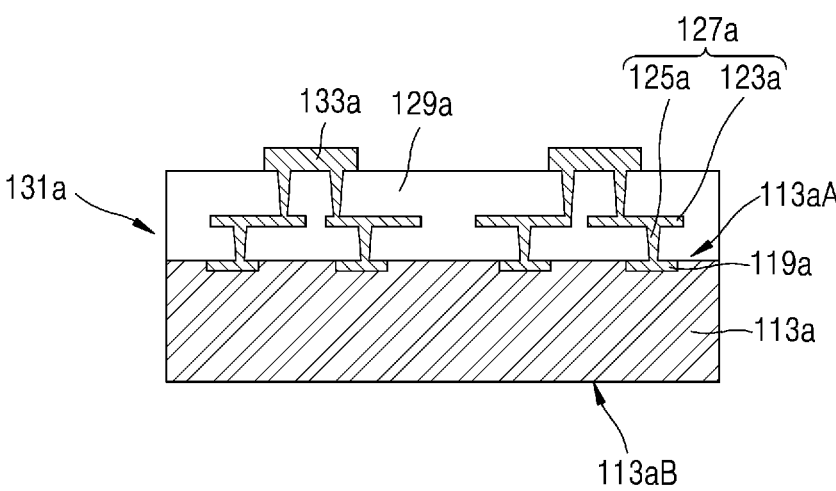
FIGS. 6 to 17 are cross-sectional views of an example embodiment of a process of manufacturing the fan-out semiconductor package shown in FIGS. 1 and 2.
Figure 6:
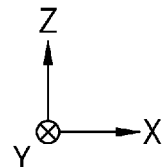

Referring to FIG. 6 together with FIG. 4, the second chip 113*a* may have a top surface and a bottom surface 113*a*B. The top surface may be an active surface on which individual elements are formed, and the bottom surface 113*a*B may be an inactive surface on which individual elements are not formed. The top surface, which is an active surface on which individual devices are formed, of the second chip 113*a* may face upward.

The third chip 111*b* may have a top surface and a bottom surface. The top surface may be an active surface on which individual elements are formed, and the bottom surface may be an inactive surface on which individual elements are not formed. The top surface, which may be an active surface on which individual devices are formed, of the third chip 111*b* may face upward.

In the first stacked chips 115*a*, the bottom surface 111*a*B of the first chip 111*a* and the bottom surface 113*a*B of the second chip 113*a* may be bonded to each other via the adhesive layer 121. A first chip pad 117*a* may be disposed on the top surface 111*a*A of the first chip 111*a*. A second chip pad 119*a* may be disposed on the top surface of the second chip 113*a*. The first chip pad 117*a* and the second chip pad 119*a* may be metal pads such as aluminum pads or copper pads, for example. The first chip pad 117*a* and the second chip pad 119*a* may be electrically conductive pads.

Figure 5:
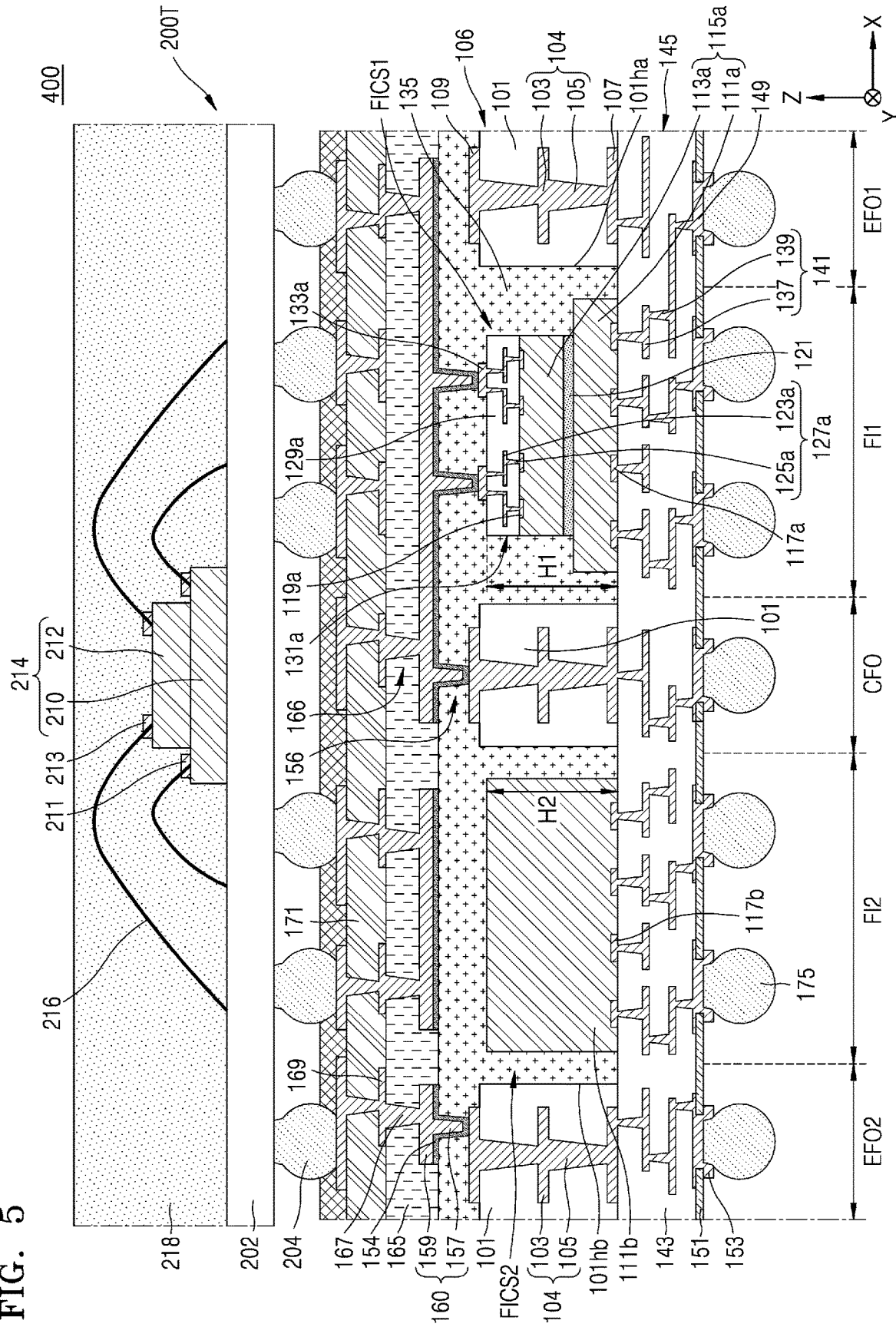
FIG. 5 is a cross-sectional view of a fan-out semiconductor package according to another example embodiment.

FIG. 5 is a cross-sectional view of a fan-out semiconductor package 400 according to another example embodiment.

In detail, the fan-out semiconductor package 400 may be identical to the fan-out semiconductor package 100 of FIG. 2 except that the fan-out semiconductor package 400 may be a stacked package in which a top package 200T including a plurality of top chips 214 is stacked. In FIG. 5, descriptions of elements denoted by the same reference numerals as in FIG. 2 will be briefly given or omitted. Here, the fan-out semiconductor package 100 is referred to as the bottom package 200B.

The fan-out semiconductor package 400 may be a stacked package including a bottom package 200B and the top package 200T. Second external connection terminals 204 may be formed on the third redistribution pads 169 of the bottom package 200B. The second external connection terminals 204 may be, for example, solder balls. The top package 200T-1 may be attached onto the second external connection terminals 204.

The top package 200T may include a top chip 214 attached onto the top wiring substrate 202. The top chip 214 may include a first top chip 210 and a second top chip 212. The first top chip 210 and the second top chip 212 may be connected to the top wiring substrate 202 through bonding wires 216. The top chip 214 may include a memory chip or a controller chip. The top package 200T may include a top encapsulation layer 218 surrounding at least a portion of the top chip 214.

FIGS. 6 to 17 are cross-sectional views of a process of manufacturing the fan-out semiconductor package 100 shown in FIGS. 1 and 2.

In FIGS. 6 to 17, reference numerals identical to those in FIGS. 1 and 2 denote the same elements. In FIGS. 6 to 17, descriptions identical to those given above with reference to FIGS. 1 and 2 will be briefly given or omitted.

Referring to FIG. 6, the second chip 113*a* and the first chip wiring structure 131*a* located on the second chip 113*a* are formed. First, the second chip 113*a* is prepared. The second chip 113*a* may have a top surface 113*a*A and the bottom surface 113*a*B. As described above, the top surface 113*a*A may be an active surface on which individual elements are formed, and the bottom surface 113*a*B may be an inactive surface on which individual elements are not formed. The top surface 113*a*A, which is an active surface on which individual devices are formed, of the second chip 113*a* may face upward. The second chip pad 119*a* may be disposed on the top surface 113*a*A of the second chip 113*a*.

Next, the first chip wiring structure 131*a* is formed on the second chip 113*a*. The first chip wiring structure 131*a* may be electrically connected to the second chip pad 119*a*. The first chip wiring structure 131*a* may be formed through a photolithography process. Since the first chip wiring structure 131*a* is formed through a photolithography process, the design freedom of the second chip 113*a* may be improved.

The first chip wiring structure 131*a* may include a first chip wiring element 127*a* and a first chip wiring pad 133*a*. The first chip wiring element 127*a* may include the first chip wiring layers 123*a* formed in a first chip wiring insulation layer 129*a* and the first chip wiring vias 125*a* electrically connecting the first chip wiring layers 123*a* to one another. The first chip wiring pad 133*a* may be electrically connected to the first chip wiring element 127*a*. The first chip wiring pad 133*a* may be the same layer as the uppermost first chip wiring layer 123*a*.

Referring to FIG. 7, the first chip 111*a* is prepared. The first chip 111*a* may have the top surface 111*a*A and the bottom surface 111*a*B. The top surface 111*a*A may be an active surface on which individual devices are formed, and the bottom surface 111*a*B may be an inactive surface on which individual devices are not formed. In the example embodiment, the first chip 111*a* may be disposed upside-down. Accordingly, in the example embodiment, it is illustrated that the top surface 111*a*A, which is an active surface on which individual devices are formed, of the first chip 111*a* faces downward.

Referring to FIG. 8, the first fan-in chip structure FICS1 is formed. The first stacked chips 115*a* are fabricated by bonding the bottom surface of the second chip 113*a* to the bottom surface of the first chip 111*a* through the adhesive layer 121. The first chip wiring structure 131*a* may be formed on the first stacked chips 115*a*. Therefore, the first fan-in chip structure FICS1 including the first stacked chips 115*a* and the first chip wiring structure 131*a* located on the first stacked chips 115*a* may be fabricated.

Figure 9:
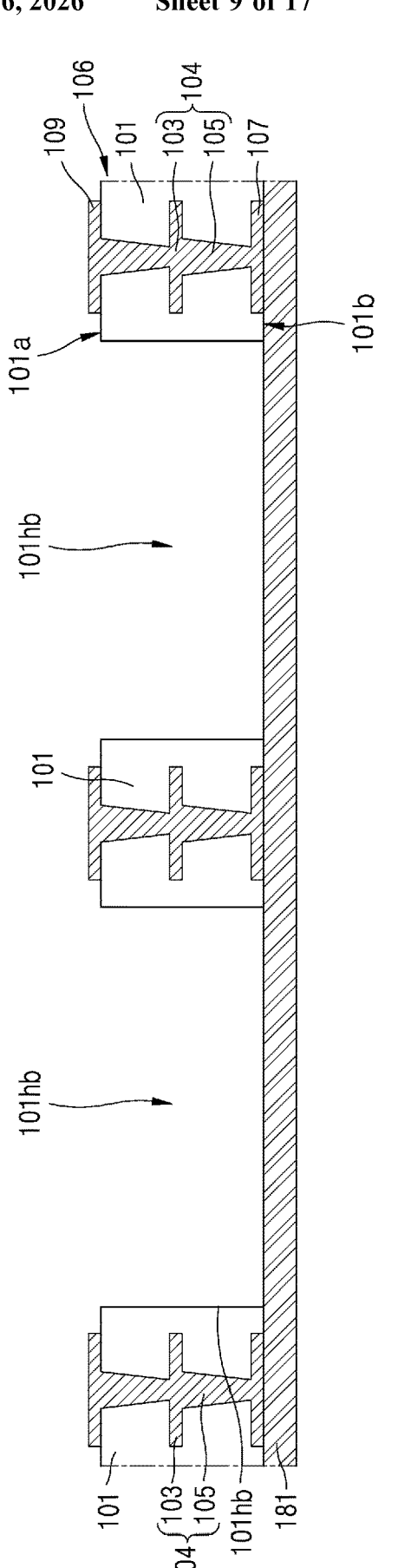
Figure 9:
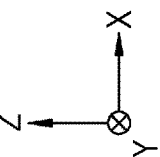

Referring to FIG. 9, the wiring substrate 106 having the first through hole 101*ha* and the second through hole 101*hb* is prepared. The wiring substrate 106 may be an insulation substrate. The wiring substrate 106 may include the body 101 positioned on both sides of the first through hole 101*ha* and the second through hole 101*hb*, a substrate wiring structure 104 formed in the body 101, and substrate wiring pads 107 and 109.

The substrate wiring structure 104 may include substrate wiring layers 103 formed in the body 101 and the substrate vias 105 connecting the substrate wiring layers 103 to one another. The substrate wiring pads 107 and 109 include the first substrate wiring pad 107 located on the bottom surface 101*b* of the body 101 and the second substrate wiring pad 109 located on the top surface 101*a* of the body 101. The first substrate wiring pad 107 may be a part of the substrate wiring layer 103 located on the bottom surface 101*b* of the body 101. The second substrate wiring pad 109 may be a part of the substrate wiring layer 103 located on the top surface 101*a* of the body 101.

Subsequently, the wiring substrate 106 in which the first through hole 101*ha* is formed may be attached to a tape substrate 181. The wiring substrate 106 may be attached onto the tape substrate 181, such that the first substrate wiring pad 107 located under the substrate vias 105 is attached to the tape substrate 181. In the example embodiment, the first through hole 101*ha* and the second through hole 101*hb* are arranged on the tape substrate 181 with an interval therebetween, and the body 101 may be located at both sides of the first through hole 101*ha* and the second through hole 101*hb*.

Figure 10:
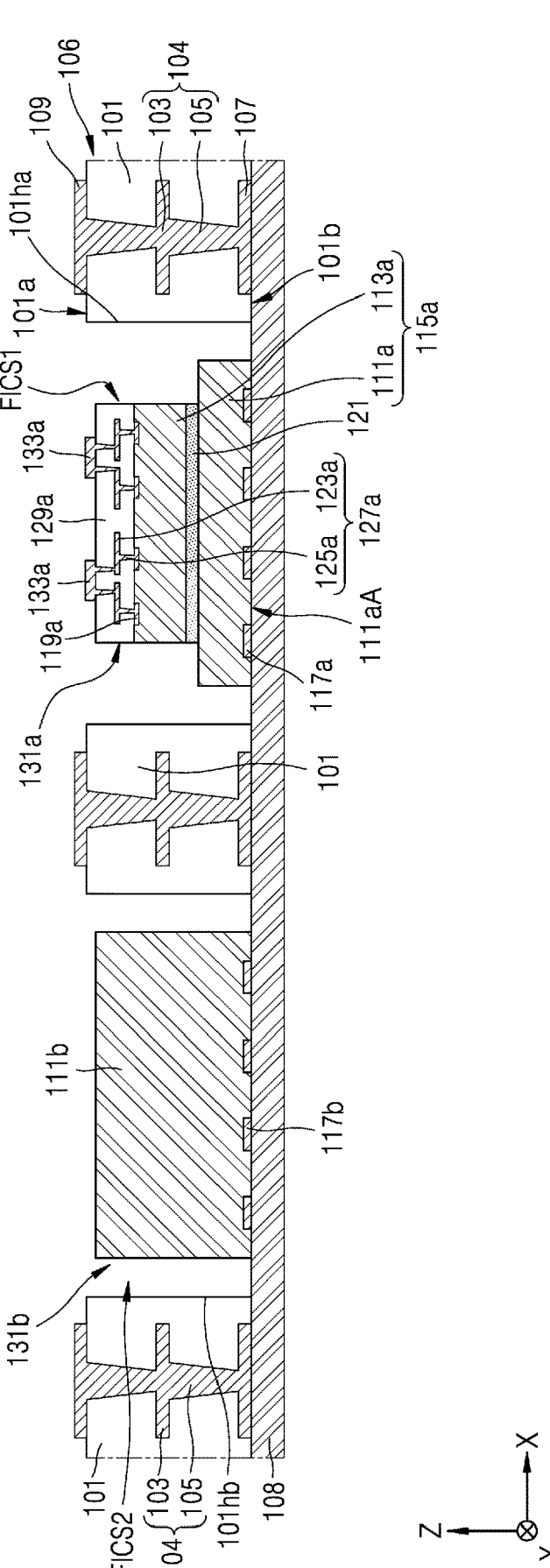

Referring to FIG. 10, the first fan-in chip structure FICS1 may be attached to the tape substrate 181, such that the first chip pad 117*a* faces down in the first through hole 101*ha* of the wiring substrate 106. In other words, the first chip 111*a* is attached to the tape substrate 181, such that the active surface (i.e., the top surface 111*a* on which the first chip pad 117*a* is formed) faces downward. Also, the second fan-in chip structure FICS2 is attached to the tape substrate 181 in the second through hole 101*hb* of the wiring substrate 106, such that a third chip pad 117*b* faces downward. In the example embodiment, the third chip 111*b* may be disposed upside-down. Accordingly, in the example embodiment, a top surface of the third chip 111*b* may face downward. In an example embodiment, the third chip 111*b* is attached to the tape substrate 181, such that the top surface on which the third chip pad 117*b* is formed faces downward. At this time, the height H1 of the first fan-in chip structure FICS1 may be smaller than or equal to the height H2 of the second fan-in chip structure FICS2.

In an example embodiment, the first fan-in chip structure FICS1, which includes the first stacked chips 115*a* including the second chip 113*a* bonded to the first chip 111*a* and the first chip wiring structure 131*a* positioned on the first stacked chips 115*a*, may be located in the first through hole 101*ha*. The top surface of the first chip wiring structure 131*a* may be located at a level lower than or at the same level as the top surface 101*a* of the body 101 constituting the wiring substrate 106. Also, the second fan-in chip structure FICS2 including the third chip 111*b* may be located in the second through hole 101*hb*.

When the first fan-in chip structure FICS1 and the second fan-in chip structure FICS2 are attached to the tape substrate 181, the first fan-in chip structure FICS1 and the second fan-in chip structure FICS2 may be located to be spaced apart from one side of the wiring substrate 106. When the first stacked chips 115*a* are spaced apart from the wiring substrate 106, a surface of the tape substrate 181 may be exposed.

Figure 11:
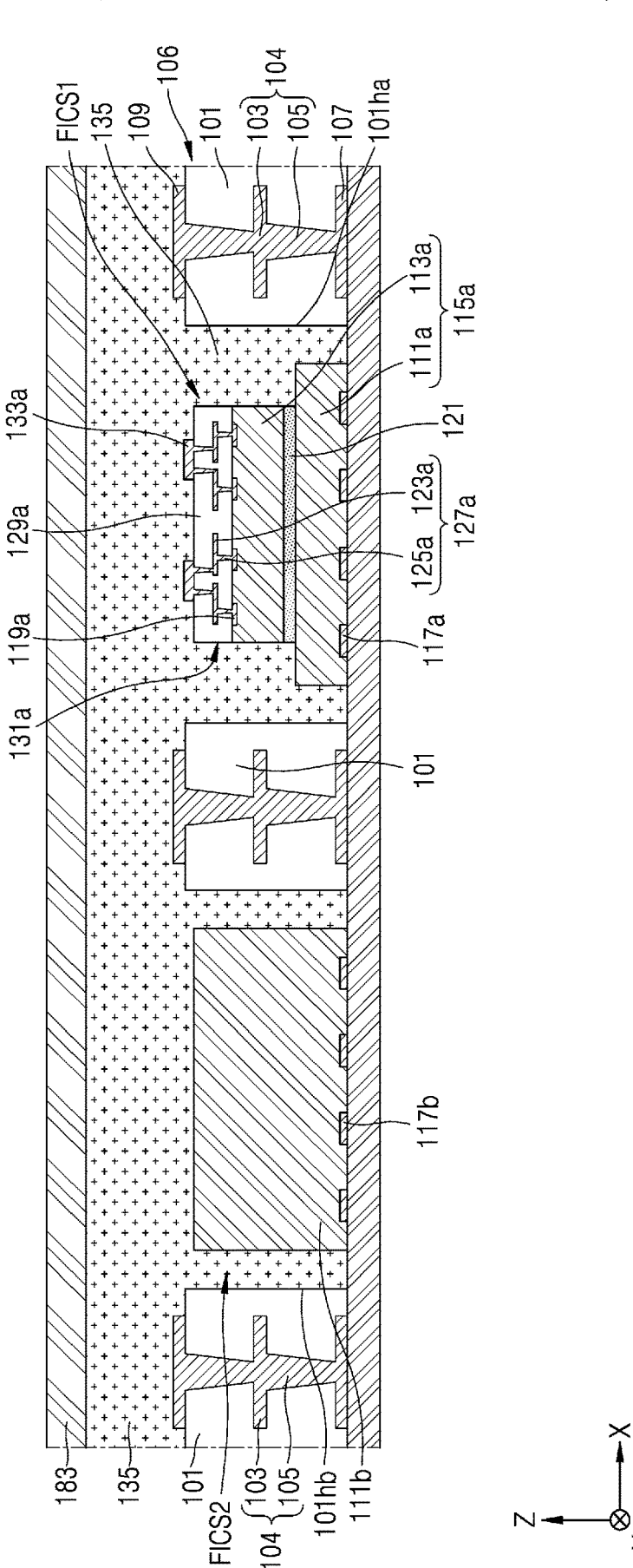

Referring to FIG. 11, the encapsulation layer 135 sealing the first fan-in chip structure FICS1, the second fan-in chip structure FICS2, and the wiring substrate 106 are formed on the tape substrate 181. The encapsulation layer 135 may be formed to a sufficient thickness to seal the first fan-in chip structure FICS1, the second fan-in chip structure FICS2, and the wiring substrate 106.

Subsequently, a first carrier substrate 183 may be attached onto the encapsulation layer 135. The first carrier substrate 183 may be an insulation substrate or a semiconductor substrate.

Figure 12:
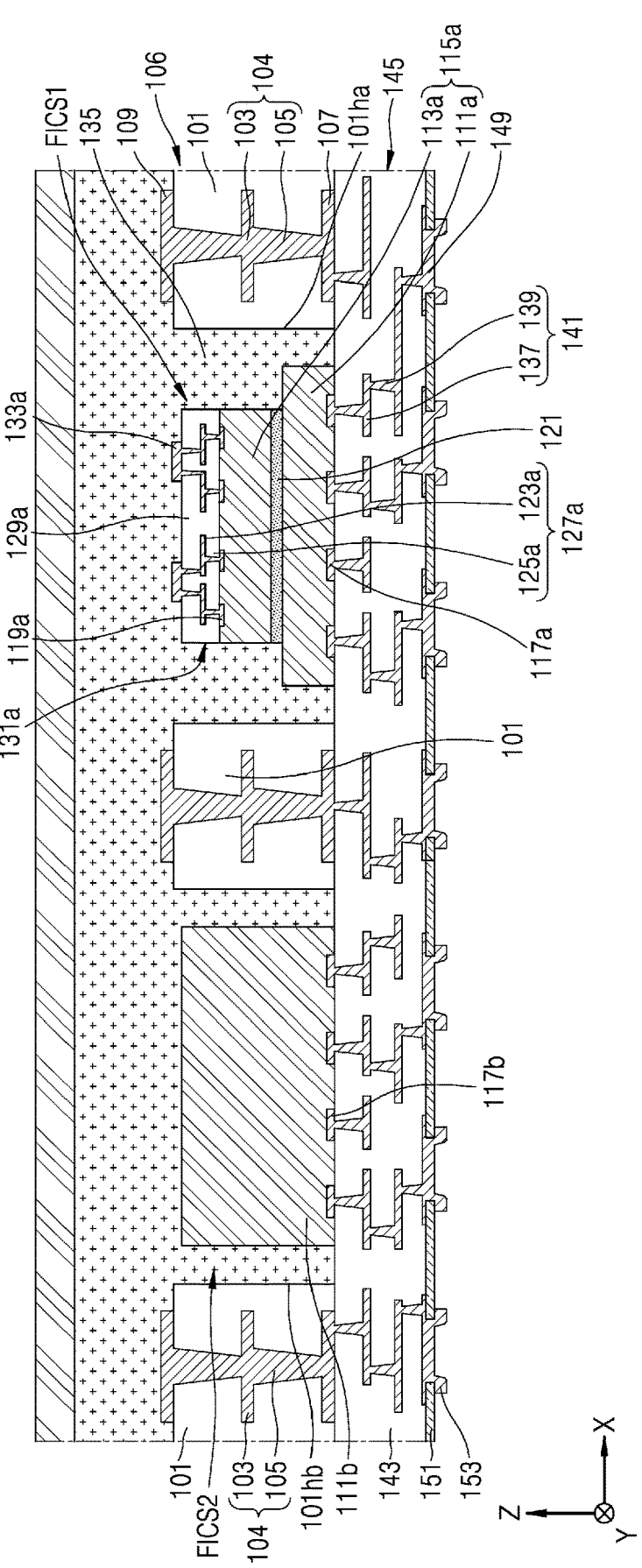

Referring to FIG. 12, the tape substrate (181 of FIG. 11) is removed. Subsequently, the first redistribution structure 145 is formed on the top surface 111*a*A of the first chip 111*a* and the bottom surface 101*b* of the body 101 constituting the first fan-in chip structure FICS1. The first redistribution structure 145 may be disposed on the bottom surface 101*b* of the body 101 and the bottom surface of the first fan-in chip structure FICS1.

The first redistribution structure 145 may include the first redistribution insulation layer 143, the first redistribution elements 141, and the first redistribution pads 149. The first redistribution elements 141 may include the first redistribution layers 137 and the first redistribution vias 139 connecting the first redistribution layers 137 to one another.

The first redistribution elements 141 may be electrically connected to the first chip pad 117*a*. As described above, the first redistribution structure 145 may extend to a fan-out region and be electrically connected to the first substrate wiring pad 107.

The first redistribution pads 149 may be electrically connected to the first redistribution structure 145. A first redistribution pad 149 may be a part of a first redistribution layer 137 located on the top surface of the first redistribution insulation layer 143.

Subsequently, the barrier metal layer 153 separated by the first passivation layer 151 may be formed on the first redistribution pads 149. The first passivation layer 151 includes an insulation layer, e.g., an oxide layer or a nitride layer.

Figure 13:
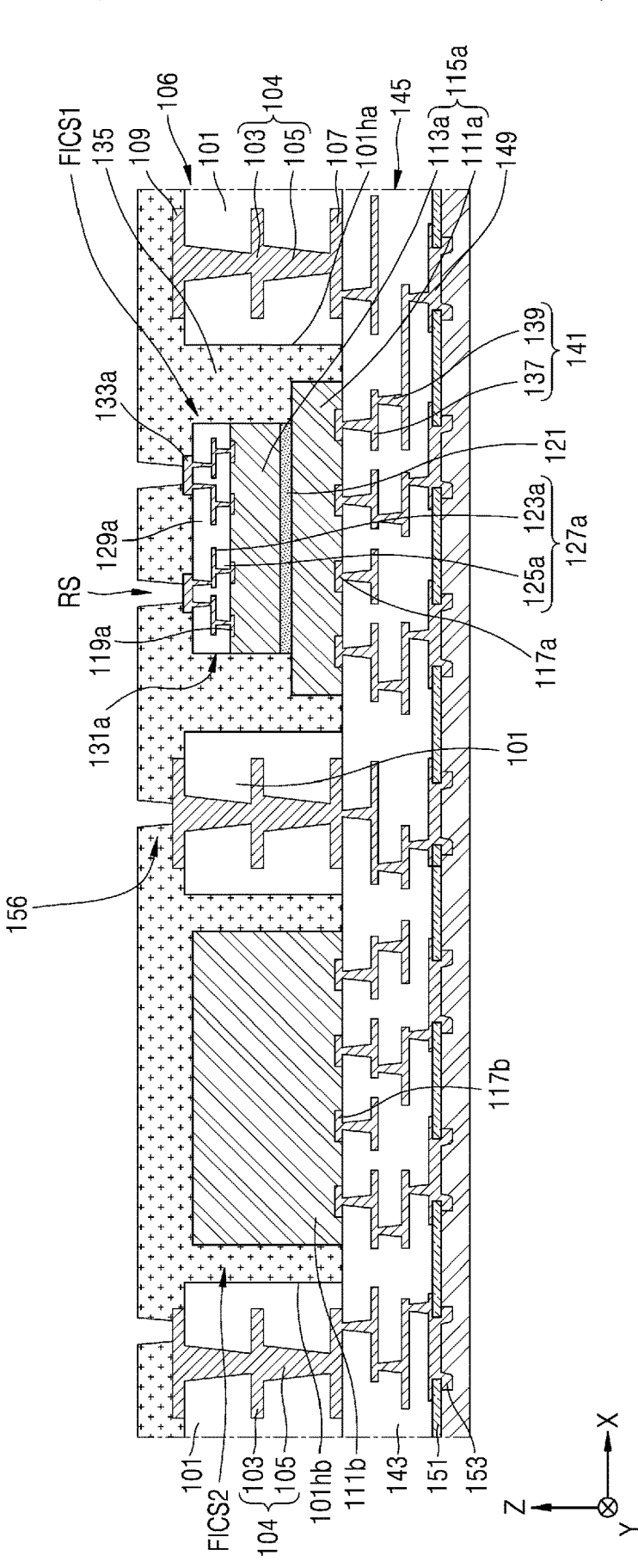

Referring to FIG. 13, in an example embodiment the first carrier substrate (183 of FIG. 12) is removed. Thereafter, a recessed region RS may be formed by etching a portion of the encapsulation layer 135. The process of etching a portion of the encapsulation layer 135 may be a photoresist process using a mask. The recessed region RS may be formed to partially expose the second substrate wiring pad 109 located on the top surface 101*a* of the body 101 and the first chip wiring pad 133*a* located at the top of the first chip wiring element 127*a*.

Figure 14:
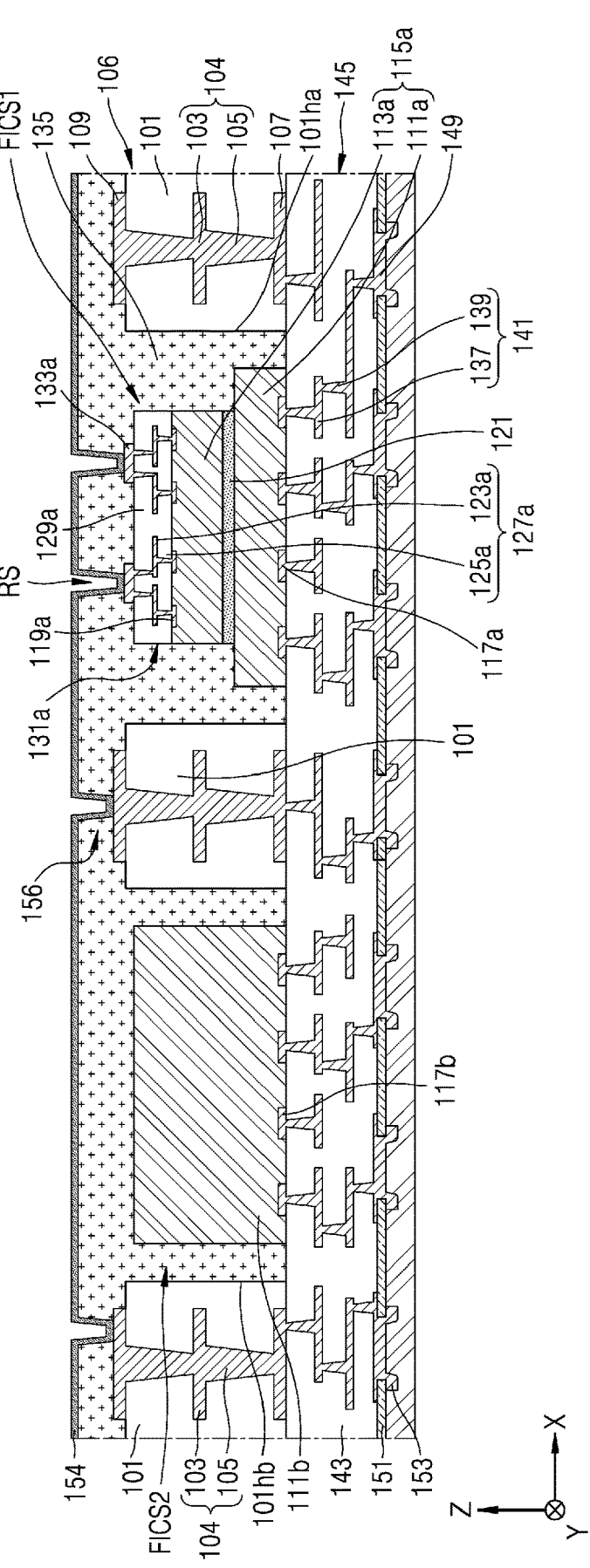

Referring to FIG. 14, the seed layer 154 may be formed in the he recessed region RS that is formed to partially expose the second substrate wiring pad 109 located on the top surface 101*a* of the body 101 and the first chip wiring pad 133*a* located at the top of the first chip wiring element 127*a*. The seed layer 154 may be formed to cover the recessed region RS and the top surface of the encapsulation layer 135. In detail, the seed layer 154 may be deposited on the recessed region RS and the top surface of the encapsulation layer 135 through a sputtering process. The sputtering process is a process for forming a layer including a metal and may be a type of physical vapor deposition process. The seed layer 154 may include a Cu—Ti alloy.

Figure 15:
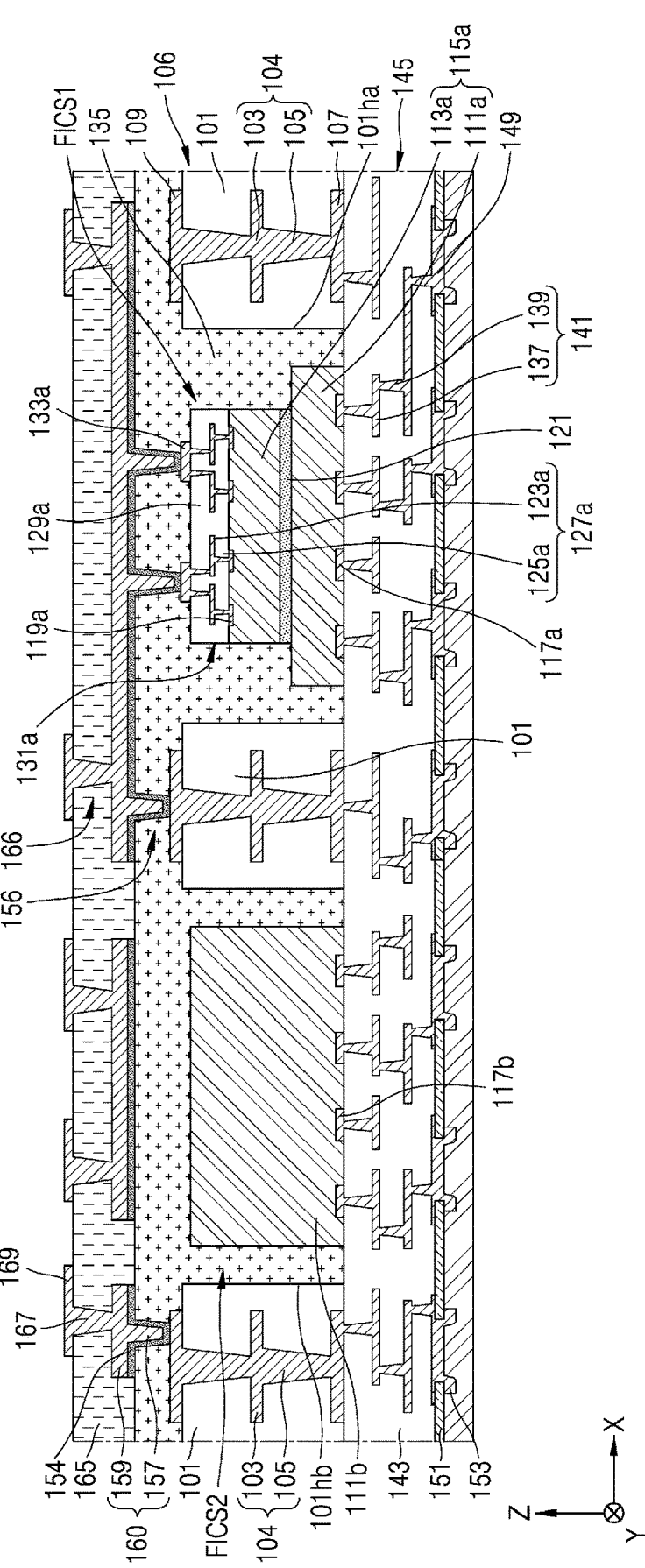

Referring to FIG. 15, after a portion of the seed layer 154 is etched, the second redistribution element 160 may be formed on the seed layer 154. By forming the second redistribution element 160, the second redistribution structure 156 may be completed on top of the first chip wiring structure 131*a*. The second redistribution structure 156 may include the seed layer 154 and the second redistribution element 160. The second redistribution elements 160 may include the second redistribution layers 159 and the second redistribution vias 157. After the second redistribution structure 156 is formed, the third redistribution insulation layer 165 covering the second redistribution structure 156 may be formed. For example, the third redistribution insulation layer 165 may include an oxide layer or a nitride layer.

The second redistribution layers 159 may extend, when viewed from above, from the fan-in region FI to the fan-out region FO and redistributed. The plurality of second redistribution vias 157 may be integrally formed with the second redistribution layer 159 and extend downward. The second redistribution element 160 may be electrically connected to the second chip pad 119*a* in the fan-in region FI. FIGS. 2 and 3 are cross-sectional views, and the second redistribution layers 159 are illustrated as being spaced apart from one another owing to the cross-sectional nature of the view. The second redistribution layers 159 may be integrally formed and continuously connected. The second redistribution elements 160 may include the same material as the substrate wiring structure 104.

The seed layer 154 may be formed to surround the bottom surface of the second redistribution layer 159 extending from the fan-in region FI to the fan-out region FO. Also, the seed layer 154 may be formed integrally with the second redistribution layer 159 to surround bottom surfaces of the plurality of second redistribution vias 157 extending downward. The seed layer 154 may include a Ti—Cu alloy. The seed layer 154 may be electrically connected to the first chip wiring pad 133*a* included in the first chip wiring structure 131*a*. Also, the seed layer 154 may be electrically connected to the second substrate wiring pad 109 included in the substrate wiring structure 104.

Thereafter, the third redistribution structure 166 may be formed on the second redistribution layer 159. The third redistribution structure 166 may include the third redistribution vias 167 and the third redistribution pads 169. The third redistribution vias 167 may electrically interconnect the third redistribution pads 169 and the second redistribution layer 159.

Figure 16:
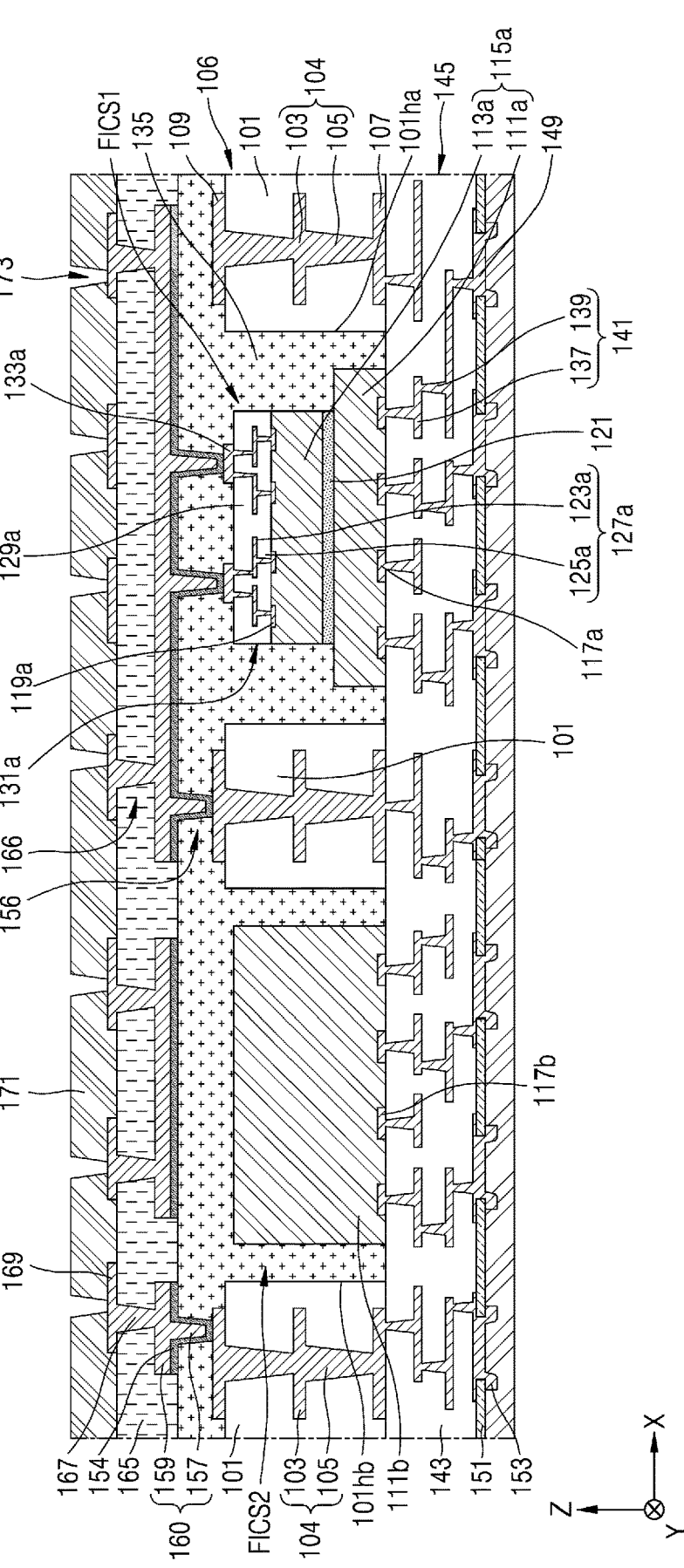
Figure 17:
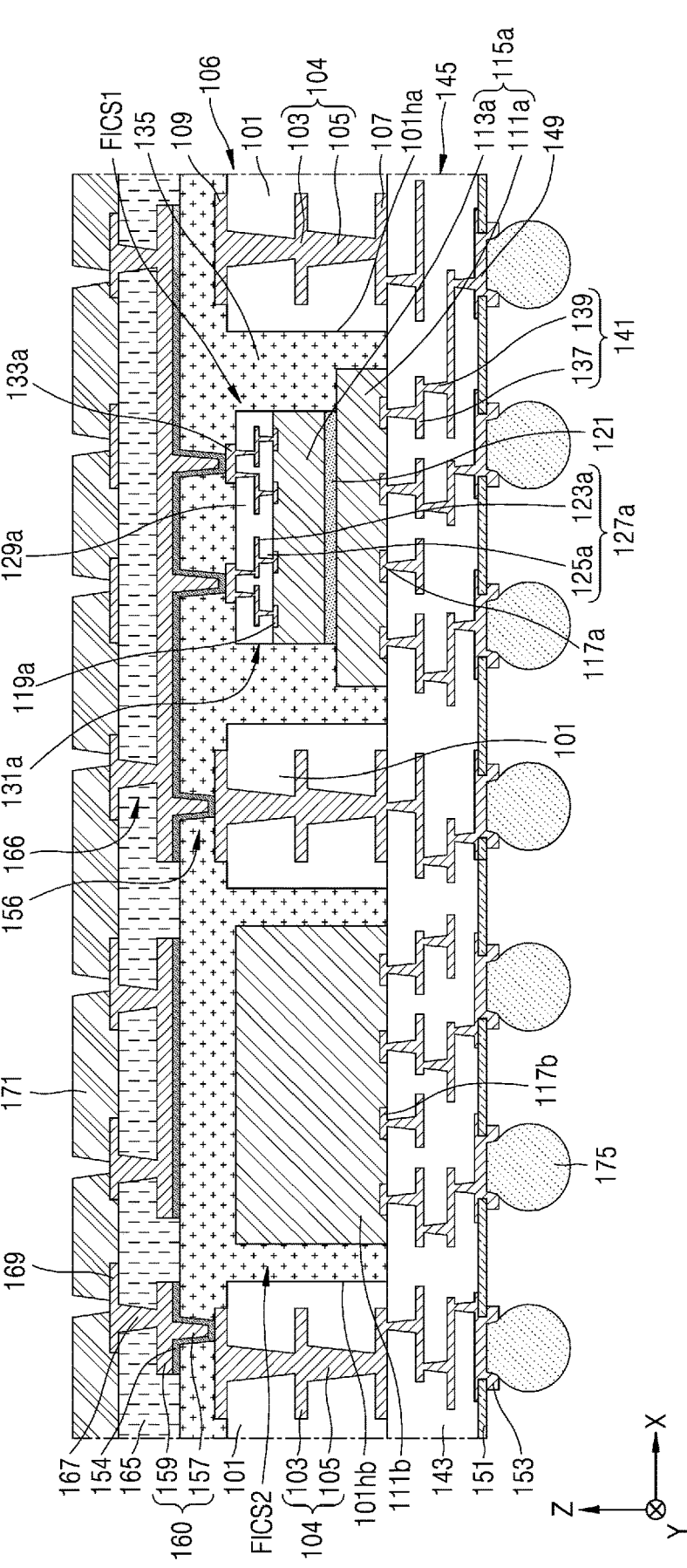

Referring to FIGS. 16 and 17, the third redistribution pads 169 may be a part of the second redistribution layer 159. The second redistribution pads 163 may be electrically isolated by the second passivation layer 171. The second redistribution pads 163 may be exposed to the outside through pad exposure holes 173. Subsequently, a second carrier substrate 185 may be removed. When the first external connection terminals 175, e.g., solder balls, are formed on the barrier metal layer 153, the fan-out semiconductor package 100 may be manufactured.

While aspects of example embodiments have been particularly shown and described, it will be understood that various changes in form and details may be made therein without departing from the spirit and scope of the following claims.

What is claimed is:

1. A fan-out semiconductor package comprising:
a wiring substrate comprising a first fan-in region corresponding to a first through hole in the wiring substrate, a fan-out region surrounding the first fan-in region, and a second fan-in region corresponding to a second through hole disposed apart from the first through hole with the fan-out region therebetween;
a first fan-in chip structure disposed in the first through hole;
a second fan-in chip structure disposed in the second through hole;
a first redistribution structure comprising first redistribution elements disposed on a bottom surface of the wiring substrate; and
a second redistribution structure on a top surface of the wiring substrate,
wherein the first fan-in chip structure comprises a first chip, a second chip bonded to a surface of the first chip, and a chip wiring structure on a top surface of the second chip, and
wherein the second redistribution structure comprises a second redistribution layer extending to the first fan-in region and the fan-out region, a plurality of second redistribution vias integrally formed with the second redistribution layer and extending downward, and a seed layer surrounding bottom surfaces of the second redistribution layer and the plurality of second redistribution vias.

2. The fan-out semiconductor package of claim 1, wherein the seed layer comprises a Ti—Cu alloy.

3. The fan-out semiconductor package of claim 1, wherein the chip wiring structure further comprises chip wiring pads, and
wherein the seed layer is electrically connected to the chip wiring pads.

4. The fan-out semiconductor package of claim 1, wherein the second fan-in chip structure comprises a third chip and third chip wiring pads, and
wherein the first redistribution elements are electrically connected to the third chip wiring pads.

5. The fan-out semiconductor package of claim 1, wherein a height of the first fan-in chip structure is equal to or smaller than a height of the second fan-in chip structure.

6. The fan-out semiconductor package of claim 1, further comprising a substrate wiring structure in the fan-out region, wherein at least some of the plurality of second redistribution vias extend toward a top surface of the substrate wiring structure.

7. The fan-out semiconductor package of claim 6, wherein the substrate wiring structure further comprises substrate wiring pads, and
wherein the first redistribution elements are electrically connected to the substrate wiring pads.

8. The fan-out semiconductor package of claim 7, wherein the substrate wiring pads are electrically connected to the seed layer.

9. The fan-out semiconductor package of claim 1, wherein a bottom surface of the first chip and a bottom surface of the second chip are inactive surfaces, and a top surface of the first chip and a top surface of the second chip are active surfaces.

10. The fan-out semiconductor package of claim 1, wherein the first fan-in chip structure further comprises a bonding layer, and
wherein the bonding layer is disposed between the first chip and the second chip and the bonding layer is configured to bond a bottom surface of the first chip to a bottom surface of the second chip.

11. The fan-out semiconductor package of claim 1, wherein the first fan-in chip structure is embedded in the first through hole and sealed by an encapsulation layer, and wherein the second fan-in chip structure is embedded in the second through hole and sealed by the encapsulation layer.

12. A fan-out semiconductor package comprising:
a wiring substrate comprising a first fan-in region corresponding to a first through hole formed in the wiring substrate, a fan-out region surrounding the first fan-in region, and a second fan-in region corresponding to a second through hole disposed apart from the first through hole with the fan-out region therebetween;
a first fan-in chip structure in the first through hole;
a second fan-in chip structure in the second through hole;
a first redistribution structure comprising first redistribution elements on a bottom surface of the wiring substrate; and
a second redistribution structure on a top surface of the wiring substrate,
wherein the first fan-in chip structure comprises a first chip, a second chip having a bottom surface bonded to a bottom surface of the first chip, and a first chip wiring structure on a top surface of the second chip,
wherein the second fan-in chip structure comprises a third chip, a fourth chip having a bottom surface bonded to a bottom surface of the third chip, and a second chip wiring structure on a top surface of the fourth chip, and
wherein the second redistribution structure comprises a second redistribution layer extending to the first fan-in region and the fan-out region, a plurality of second redistribution vias integrally formed with the second redistribution layer and extending downward, and a seed layer surrounding bottom surfaces of the second redistribution layer and the plurality of second redistribution vias.

13. The fan-out semiconductor package of claim 12, wherein the bottom surface of the first chip, the bottom surface of the second chip, the bottom surface of the third chip, and the bottom surface of the fourth chip are inactive surfaces, and
wherein a top surface of the first chip, the top surface of the second chip, a top surface of the third chip, and the top surface of the fourth chip are active surfaces.

14. The fan-out semiconductor package of claim 12, wherein a height of the first fan-in chip structure is equal to or greater than a height of the second fan-in chip structure.

15. The fan-out semiconductor package of claim 12, wherein a height of the first fan-in chip structure is equal to or smaller than a height of the second fan-in chip structure.

16. The fan-out semiconductor package of claim 12, wherein the seed layer comprises a Ti—Cu alloy.

17. The fan-out semiconductor package of claim 12, further comprising an encapsulation layer on both side surfaces of the first fan-in chip structure in the first through hole and on both side surfaces of the second fan-in chip structure in the second through hole.

18. The fan-out semiconductor package of claim 12, wherein the wiring substrate comprises at least one of an insulating substrate or a semiconductor substrate.

19. A fan-out semiconductor package comprising:
a wiring substrate comprising a first fan-in region corresponding to a first through hole in the wiring substrate, a fan-out region surrounding the first fan-in region, and a second fan-in region corresponding to a second through hole disposed apart from the first through hole with the fan-out region therebetween;
a first fan-in chip structure disposed in the first through hole;
a second fan-in chip structure disposed in the second through hole;
a first redistribution structure comprising first redistribution elements on a bottom surface of the wiring substrate; and
a second redistribution structure on a top surface of the wiring substrate,
wherein the first fan-in chip structure comprises a first chip, a second chip having a bottom surface bonded to a bottom surface of the first chip, and a chip wiring structure on a top surface of the second chip,
wherein the second fan-in chip structure comprises a third chip and third chip wiring pads,
wherein the first redistribution elements are electrically connected to the third chip wiring pads,
wherein the second redistribution structure comprises a second redistribution layer extending to the first fan-in region and the fan-out region, a plurality of second redistribution vias integrally formed with the second redistribution layer and extending downward, and a seed layer surrounding bottom surfaces of the second redistribution layer and the plurality of second redistribution vias and comprising a Ti—Cu alloy,
wherein the chip wiring structure further comprises chip wiring pads,
wherein the seed layer is electrically connected to the chip wiring pads,
wherein bottom surfaces of the first chip and the second chip are inactive surfaces,
wherein top surfaces of the first chip and the second chip are active surfaces,
wherein the first fan-in chip structure further comprises a bonding layer disposed between the first chip and the second chip and wherein the bonding layer is configured to bond the bottom surface of the first chip to the bottom surface of the second chip,
wherein the wiring substrate comprises at least one of an insulating substrate or a semiconductor substrate,
wherein the first fan-in chip structure is embedded in the first through hole and sealed by an encapsulation layer, and
wherein the second fan-in chip structure is embedded in the second through hole and sealed by the encapsulation layer.

20. The fan-out semiconductor package of claim 19, further comprising a substrate wiring structure in the fan-out region,
wherein at least some of the plurality of second redistribution vias extend toward a top surface of the substrate wiring structure,
wherein the substrate wiring structure further comprises substrate wiring pads, and
wherein the first redistribution elements are electrically connected to the substrate wiring pads.

* * * * *